United States Patent [19]

Cachier

[11] 4,054,875
[45] Oct. 18, 1977

[54] MICROWAVE CIRCUIT FOR OPERATING ON MICROWAVE RADIATIONS

[75] Inventor: Gerard Cachier, Paris, France

[73] Assignee: Thomson-CSF, Paris, France

[21] Appl. No.: 650,262

[22] Filed: Jan. 19, 1976

[30] Foreign Application Priority Data

Jan. 22, 1975 France .................... 75.01970

[51] Int. Cl.² .................................... H01Q 1/26
[52] U.S. Cl. .......................... 343/701; 325/449;
  331/97; 331/107 R; 333/82 R; 343/845;
  343/873
[58] Field of Search ............ 333/82 R, 83 R, 73 W;
  343/701, 873, 845, 739; 331/96, 97, 101, 107 R,
  107 G, 117 D; 325/445, 449

[56] References Cited

U.S. PATENT DOCUMENTS

| 2,894,124 | 7/1959 | Himmel et al. ............ 343/739 X |
| 3,553,610 | 1/1971 | Brenner et al. ............ 333/83 R |
| 3,668,551 | 6/1972 | Kondo ........................ 331/96 |
| 3,696,314 | 10/1972 | Kell et al. ................ 333/73 W |
| 3,924,208 | 12/1975 | Plourde ...................... 333/82 R |

*Primary Examiner*—Paul L. Gensler
*Attorney, Agent, or Firm*—Cushman, Darby & Cushman

[57] ABSTRACT

The present invention relates to microwave circuits for operating on microwave radiations. It consists in combining a dielectric resonator and a microwave diode in a hybrid or integrated circuit, in order to provide a circuit which will operate without any external elements other than a direct current supply for the transmitter and a local microwave radiation for the receiver.

10 Claims, 6 Drawing Figures

MICROWAVE CIRCUIT FOR OPERATING ON MICROWAVE RADIATIONS

The present invention relates to microwave circuits for operating on microwave radiations and used to radiate or receive electromagnetic energy.

A circuit of this kind currently comprises at least the following:

a diode, working as an oscillator because of its negative resistance in the transmitter circuits, as a mixer in the receiver circuits;

a casing protecting said diode and used for its assembly;

a resonant cavity which selects an oscillatory frequency or applies a correct load impedance on the diode, these two expressions being different connotations of one and the same physical reality;

a waveguide for transferring the electromagnetic energy;

a horn to radiate the energy to free space.

The technology of the so-called microstrip, makes it possible to replace the waveguides and the cavities but the attenuation is excessive in the millimeter waveband.

Those skilled in the art will be aware that a volume of dielectric exhibiting low losses and high permitivity (for example silicon or gallium arsenide of high resistivity, or again alumina), makes it possible to concentrate the electromagnetic field and that the radiation from this kind of volume is sufficiently weak to enable resonance to take place there. This volume then resonates in accordance with modes which depend upon its geometry and which determine the resonance frequencies; it is referred to as a dielectric resonator. Considering a rectangular parallepiped of low height, whose base is a rectangle of relatively small elongation, the lowest resonance frequency depends substantially only on the volume and is located at around 50 gigahertz for example, for a volume of 1 mm$^3$.

Hitherto, it has not been possible to excite this kind of resonator by means of a microwave diode, using simple means, and it has not been possible to utilise the electromagnetic field thus produced, except if it is extracted using a waveguide.

In accordance with the present invention it is provided a microwave circuit for operating on microwave radiations, which comprises:

an electrically conductive substrate for reflecting said microwave radiations;

a dielectric resonator;

a semiconductor diode lying above said substrate and being surrounded by said resonator;

a terminal pair;

electric means for connecting said diode to said terminal pair; and coupling means for coupling said diode to said resonator.

For a better understanding of the invention, and to show how the same may be carried into effect, reference will be made to the ensuing description and to the attached figures among which:

FIG. 1a illustrates a hybrid circuit viewed in section on A;

FIG. b illustrates the circuit of FIG. 1a in section on B; FIG. 2 illustrates a hybrid circuit which is a variant embodiment of the preceding circuit;

Because of the reversible nature of the propagation of electromagnetic waves, the passive components of the receiver circuits are the same as those of the transmitter circuits. The active components are oscillator diodes in the case of transmission and mixer diodes in the case of reception. Accordingly, in the ensuing description, we shall confine ourselves to transmitter circuits although it should be understood that with each transmitter circuit there corresponds a similar receiver circuit.

Figure 1A:
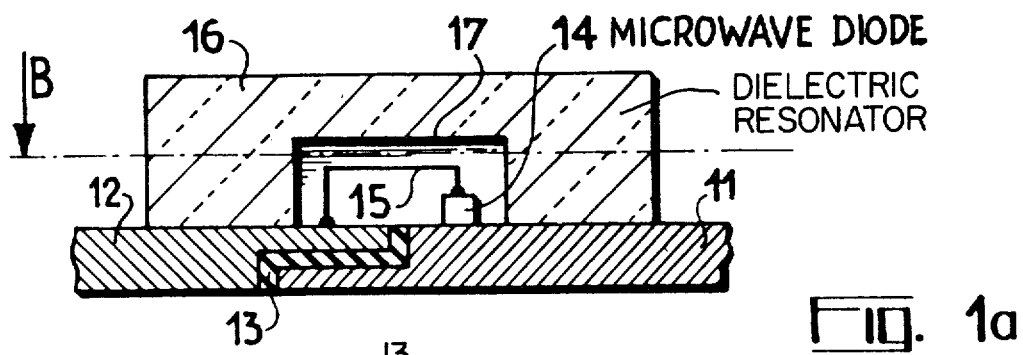
Figure 1B:
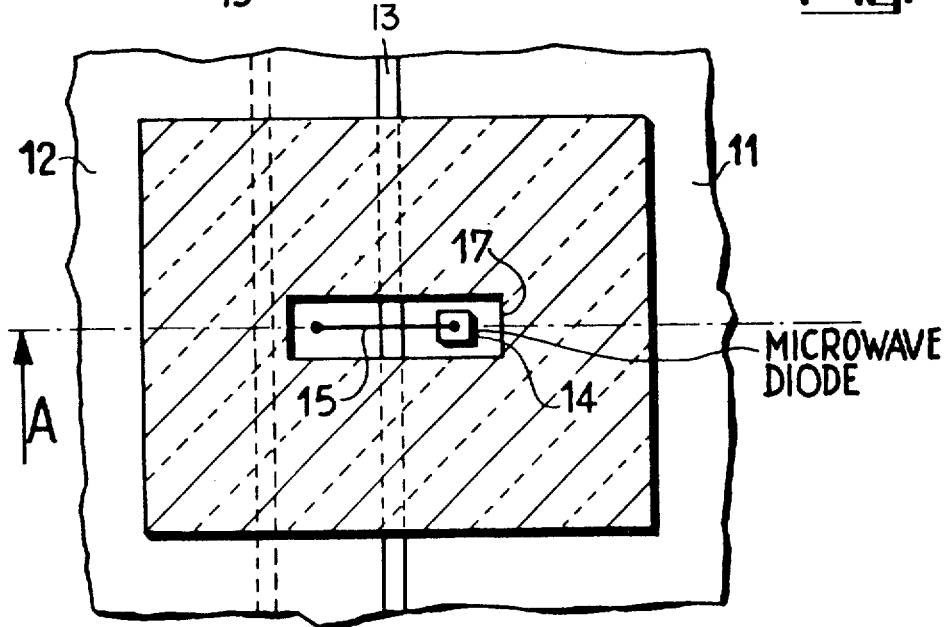

In a first embodiment shown in FIGS. 1a and 1b, two metal plates 11 and 12 have been used forming an electrically conductive substrate for reflecting the microwave radiations. These plates have been assembled in the same plane with a joint or junction machined in order, in accordance with a known method, to form a $\lambda/4$ trap.

This junction is filled with an insulator 13 which electrically isolates the two plates from one another. The plates are fitted with a terminal pair not shown on the Fig. To the plate 11 a microwave diode 14 has been soldered and this diode connected to the plate 12 by a wire 15 soldered to the diode and to the plate 12. Subsequently, a dielectric resonator 16 has been stuck to the plates. This resonator is a GaAs block of high resistivity, machined as a rectangular parallelepiped. In this block, a cavity 17 has been formed in order to accept the diode 14 and the wire 15. The diode is reduced to a simple active "pin head", without a casing, and is protected since it is enclosed in the cavity 17 which itself is closed off by the plates 11 and 12 and the insulator 13. The wire 15 is extended parallel to the plates 11 and 12 and its length is such that it constitutes a half-dipole tuned to the resonance frequency of the resonator 16.

Figure 2:
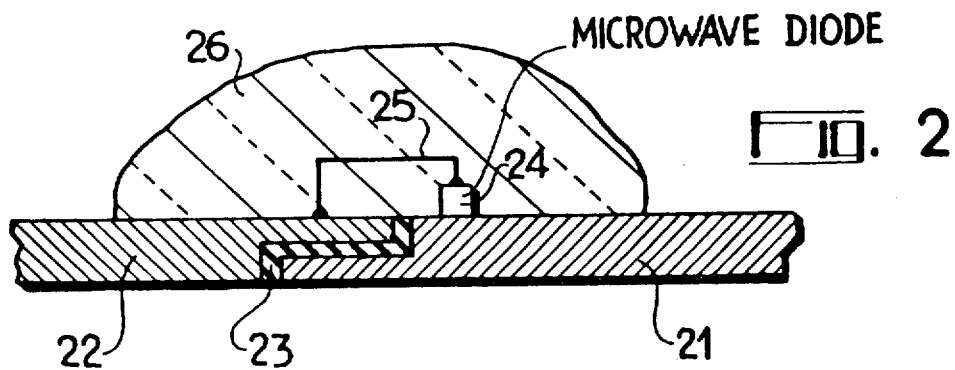

In a second embodiment shown in FIG. 2, in the same manner two metal plates 21 and 22 jointed to form a $\lambda/4$ trap and separated by an insulator 23, have been used. To the plate 21 a microwave diode 24 has been soldered and this diode connected to the plate 22 by a wire 25 soldered to the diode of the plate 22. Then, a droplet of low melting point glass has been deposited in order to form the dielectric resonator 26 which encloses the diode 24 and the wire 25. The diode 24 and the wire 25 will have been soldered by a known method which produces a soldered joint capable of withstanding the melting temperature of the deposited glass. Any other suitable dielectric can be used in order to form a dielectric resonator, which has an adequately low melting point or is soluble in a volatile solvent or is polymerisable from the pasty state to the solid state. Accordingly, the soldering method will be chosen as a function of the temperatures to which the soldered joints are to be subjected.

As in the first embodiment, the diode is a bare "pin head" and the wire 25 is designed for a half-dipole.

Figure 3B:
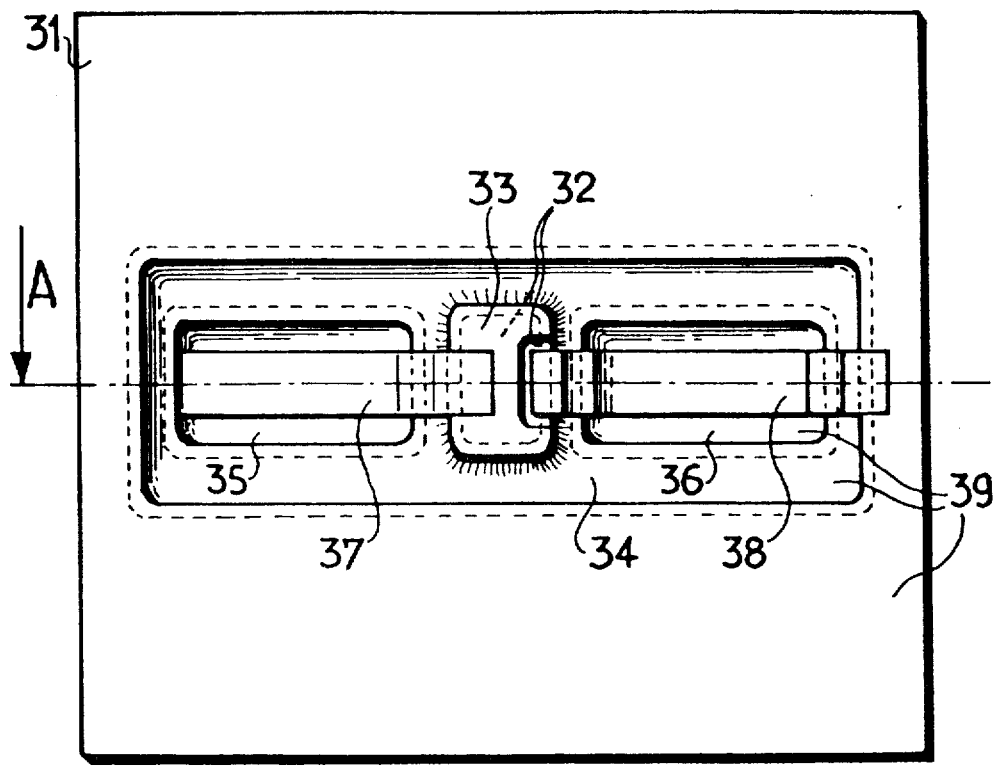
FIG. 3b illustrates the circuit of FIG. 3a seen in section on B.
Figure 3A:
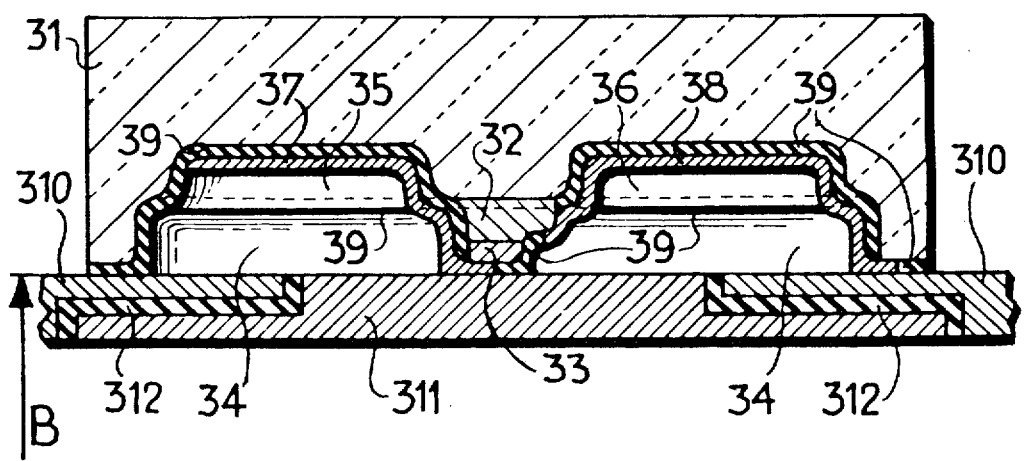
FIG. 3a illustrates a monolithic circuit viewed in section on A.

In a third embodiment shown in FIGS. 3a and 3b, a high resistivity silicon block has been used, and has been machined as a rectangular parallepiped in order to form a dielectric resonator 31. Using known methods employed in the manufacture of integrated circuits, the following elements have been formed:

the microwave diode which comprises the two diffused zones 32 and 33;

the cavity 34 for giving the diode mesa structure;

the cavities 35 and 36 which locate the two sections 37 and 38 of the dipole which excites the resonator 31;

the silicon oxide layer 39 which protects the silicon surface and acts as an insulator between the silicon and the dipole 37/38;

the two sections 37 and 38 which are made of metal and deposited by vapourisation, these making contact in one case (37) with the zone 33 of the diode and in the other case (38) with the layer 32 of the diode.

Subsequently, the circuit thus obtained was arranged on two concentric metal discs 310 and 311. The junction between these discs was machined in order, in a manner known per se, to form a λ/4 trap. An insulator 312 was used to fill the junction in order to isolate the two discs from the electrical point of view. The disc 310 has contact with the section 38 of the dipole and the disc 311 with the section 37. The length of the dipole is such that it is tuned to the resonance frequency of the resonator 31.

Figure 4:
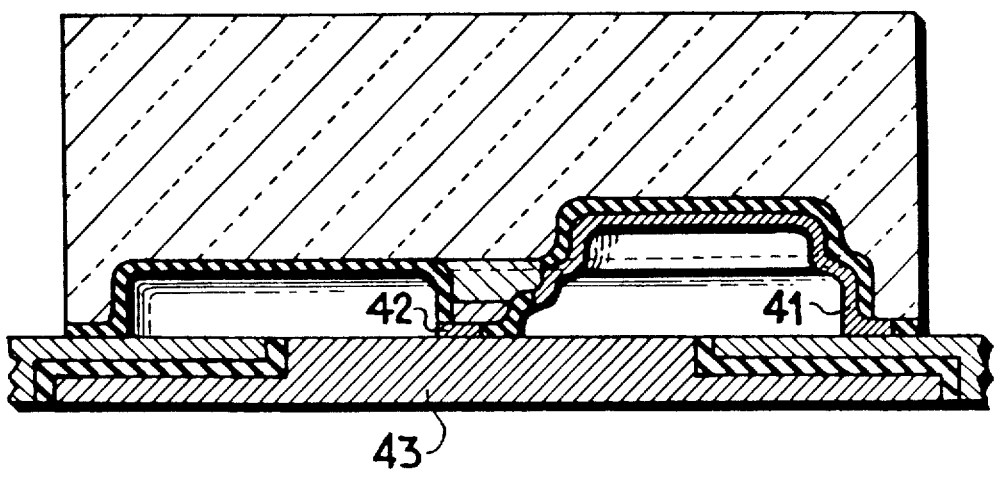
FIG. 4 illustrates a monolithic circuit which is a variant embodiment of the circuit shown in FIGS. 3a and 3b.

A variant form of this third embodiment has been shown in FIG. 4. It consists in manufacturing a circuit which is entirely similar to the preceding one but in which there is only one dipole section 41, this making contact with the lowest layer of the diode. The external layer of the diode simply comprises a metal tablet 42 for connection with the disc 43.

To utilise these circuits, it is merely necessary to connect the plates of the embodiments 1 and 2 or the discs of the embodiments 3 and 4 to a direct voltage source of appropriate polarity, depending upon the diode use. The circuits then transmit a microwave radiation directly to free space.

In the case of a receiving circuit the microwave diode is a non linear element, thus being used as a mixer element, and the circuit is fed with a local microwave radiation by the way of the two parts of the substrate plate. So the circuit receives directly from free space a microwave radiation and the intermediate frequency resulting from the mixing of this received microwave radiation with the local microwave radiation is going out the circuit by the way of said two parts of the substrate plate.

What I claim is:

1. A microwave circuit for radiating microwave radiations, which comprises:

an electrically conductive substrate for reflecting said microwave radiations;

a dielectric resonator made of semiconductor material and mounted on said substrate;

a semiconductor oscillator diode fitted with two connections, lying above said substrate and being a structure integrated onto the face of said resonator adjacent to said substrate; and means for coupling said diode to said resonator, and simultaneously connecting the diode to an external biasing source.

2. A microwave circuit as claimed in claim 1, wherein said conductive substrate is divided in two parts separated by a dielectric gap having the form of a microwave trap; said two parts being connected to said coupling means.

3. A microwave circuit as claimed in claim 2, wherein one of said two parts is directly connected to one of said two connections, and the other of said two parts is connected to the other of said two connections by the way of a conductor, said conductor being integral of said coupling means and constituting a half-dipole tuned to the resonance frequency of said dielectric resonator.

4. A microwave circuit as claimed in claim 2, wherein said two parts are respectively connected to said two connections by the way of two conductors; said conductors being integral of said coupling means and constituting a dipole tuned to the resonance frequency of said dielectric resonator.

5. A microwave circuit as claimed in claim 2, wherein said dielectric resonator is a rectangular parallelepiped of gallium arsenide.

6. A microwave circuit for receiving microwave radiations, which comprises:

an electrically conductive substrate for reflecting said microwave radiations;

a dielectric resonator made of semiconductor material and mounted on said substrate;

a semiconductor mixer diode fitted with two connections, lying above said substrate and being a structure integrated onto the face of said resonator adjacent to said substrate; and means for coupling said diode to said resonator, and simultaneously connecting the diode to an external local microwave radiation source.

7. A microwave circuit as claimed in claim 6, wherein said conductive substrate is divided in two parts separated by a dielectric gap having the form of a microwave trap; said two parts being connected to said coupling means.

8. A microwave circuit as claimed in claim 7, wherein one of said two parts is directly connected to one of said two connections, and the other of said two parts is connected to the other of said two connections by the way of a conductor; said conductor being integral of said coupling means and constituting a half-dipole tuned to the resonance frequency of said dielectric resonator.

9. A microwave circuit as claimed in claim 7, wherein said two parts are respectively connected to said two connections by the way of two conductors; said conductors being integral of said coupling means and constituting a dipole tuned to the resonance frequency of said dielectric resonator.

10. A microwave circuit as claimed in claim 7, wherein said dielectric resonator is a rectangular parallelepiped of gallium arsenide.

* * * * *